(12) United States Patent
Paul et al.

(10) Patent No.: US 7,911,021 B2
(45) Date of Patent: Mar. 22, 2011

(54) EDGE TERMINATION FOR SEMICONDUCTOR DEVICES

(75) Inventors: Amit Paul, Sunnyvale, CA (US); Mohamed N. Darwish, Campbell, CA (US); Jun Zeng, Torrance, CA (US)

(73) Assignee: Maxpower Semiconductor Inc., Santa Clara, CA (US)

( * ) Notice: Subject to any disclaimer, the term of this patent is extended or adjusted under 35 U.S.C. 154(b) by 0 days.

(21) Appl. No.: 12/418,808

(22) Filed: Apr. 6, 2009

(65) Prior Publication Data
US 2009/0294892 A1  Dec. 3, 2009

Related U.S. Application Data

(60) Provisional application No. 61/058,069, filed on Jun. 2, 2008.

(51) Int. Cl.
*H01L 29/02* (2006.01)
(52) U.S. Cl. .................. 257/494; 257/E29.327
(58) Field of Classification Search .......... 257/494, 257/141, E29.327, E29.008, 487, 491, 534, 257/E29.007; 438/170, 142, 248
See application file for complete search history.

(56) References Cited

U.S. PATENT DOCUMENTS

| | | | |
|---|---|---|---|
| 5,282,018 A | 1/1994 | Hiraki et al. | |
| 5,637,898 A | 6/1997 | Baliga | |
| 5,864,159 A | 1/1999 | Takahashi | |
| 5,973,359 A | 10/1999 | Kobayashi et al. | |
| 5,998,833 A | 12/1999 | Baliga | |
| 6,031,265 A * | 2/2000 | Hshieh | 257/334 |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,388,286 B1 | 5/2002 | Baliga | |
| 6,509,233 B2 | 1/2003 | Chang et al. | |
| 6,525,373 B1 | 2/2003 | Kim | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 7,176,519 B2 | 2/2007 | Schuler | |
| 7,211,487 B2 | 5/2007 | Chindalore | |
| 7,459,740 B2 | 12/2008 | Bhattacharyya et al. | |
| 2001/0041407 A1 | 11/2001 | Brown | |
| 2003/0203576 A1 | 10/2003 | Kitada et al. | |
| 2005/0215011 A1 * | 9/2005 | Darwish et al. | 438/270 |
| 2006/0060916 A1 | 3/2006 | Girdhar et al. | |
| 2008/0164518 A1 | 7/2008 | Darwish | |

OTHER PUBLICATIONS

Watt et al., "A Low-Temperature NMOS Technology with Cesium-Implated Load Devices", IEEE Transactions on Electron Devices, vol. 34, No. 1, Jan. 1987, pp. 28-38.
Pfiester et al., "Gain Enhanced LDD NMOS Device Using Cesium Implantation", IEEE Transactions on Electron Devices, vol. 39, No. 6, Jun. 1992, pp. 1469-1476.

(Continued)

*Primary Examiner* — Thomas L Dickey
*Assistant Examiner* — Nikolay Yushin
(74) *Attorney, Agent, or Firm* — Robert Groover; Groover & Associates (57) ABSTRACT

A high-voltage termination structure includes a peripheral voltage-spreading network. One or more trench structures are connected at least partly in series between first and second power supply voltages. The trench structures include first and second current-limiting structures connected in series with a semiconductor material, and also includes permanent charge in a trench-wall dielectric. The current-limiting structures in the trench structures are jointly connected in a series-parallel ladder configuration. The current-limiting structures, in combination with the semiconductor material, provide a voltage distribution between the core portion and the edge portion.

19 Claims, 12 Drawing Sheets

OTHER PUBLICATIONS

J. T. Watt, B. J. Fishbein & J. D. Plummer; Low-Temperature NMOS Technology with Cesium-Implanted Load Devices; IEEE Trans. Electron Devices, vol. 34, # 1, Jan. '87; p. 28-38.

J.T.Watt,B.J.Fishbein & J.D.Plummer;Characterization of Surface Mobility in MOS Structures Containing Interfacial Cesium Ions;IEEE Trans.Electron Devices,V36,Jan.'89; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun. '92; p.1469-1476.

The International Search Report and the Written Opinion of the International Searching Authority, PCT/US2009/039612, Nov. 30, 2009.

* cited by examiner

EDGE TERMINATION FOR SEMICONDUCTOR DEVICES

CROSS-REFERENCE

Priority is claimed from U.S. Patent Application No. 61/058,069, filed Jun. 2, 2008, which is hereby incorporated by reference.

BACKGROUND

The present application relates to power semiconductor devices, and more particularly to edge termination configurations in power semiconductor devices.

Note that the points discussed below may reflect the hindsight gained from the disclosed inventions, and are not necessarily admitted to be prior art.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF SAMPLE EMBODIMENTS

A known issue in power semiconductor devices is the location at which conduction is initiated when the reverse bias between the supply voltage and ground voltage exceeds the breakdown voltage of the device. For example, conventional n-channel power FET devices often have a front contact for ground (source) voltage and a rear contact for the positive (drain) voltage. If this conduction occurs at the edge of the semiconductor die, it is possible to damage or destroy the device. This problem is all the worse since energetic carriers (usually "hot" conduction electrons) can tunnel into the dielectric at the device surface, permanently altering the electrical characteristics of the device or even destroying it.

Edge termination of such high voltage structures is required to realize a breakdown voltage at the device periphery equal to or greater than that of the device active area.

In the design and fabrication of semiconductor devices, permanent charges may be established in materials by various methods, including the implantation of certain atomic species. Permanent or fixed charge embedded in insulation material, for example, has been used to fabricate devices such as depletion mode vertical DMOS transistors. As disclosed in U.S. patent publication No. 20080164518, filed on Jan. 8, 2008, incorporated herein by reference, these permanent or fixed charges can also be used to fabricate efficient high voltage devices with low specific on-resistance.

This application discloses a number of device termination structures that can be used for edge termination of high voltage devices making use of permanent charge. In one class of disclosed embodiments, a high-voltage termination structure includes a peripheral voltage-spreading network. One or more trench structures are connected at least partly in series between first and second power supply voltages. The trench structures include first and second current-limiting structures connected in series with a semiconductor material, and also include permanent charge in a trench-wall dielectric. Preferably the current-limiting structures in the trench structures are jointly connected in a series-parallel ladder configuration. The current-limiting structures, in combination with the semiconductor material, provide a voltage distribution between the core portion and the edge portion. These structures increase the breakdown voltage at the edge of the active device area so breakdown occurs at a location away from the edge.

Various disclosed embodiments, in various combinations, provide one or more of the following advantages:

Breakdown voltage in the termination region is increased to be equal to or greater than the breakdown voltage in the active switching area.

The whole chip has a higher net breakdown voltage.

Excessive area is not wasted in the termination.

Multiple cells can be separately terminated.

Conduction along the edge of a semiconductor die is reduced or eliminated.

Durability under electrical and/or electromagnetic transients is improved.

The numerous innovative teachings of the present application will be described with particular reference to presently preferred embodiments (by way of example, and not of limitation). The present application describes several inventions, and none of the statements below should be taken as limiting the claims generally.

A vertical high voltage device has a high electric field that is seen within the active cells resulting from the applied voltage across the device between the top and bottom terminals. In order to successfully terminate a high voltage device, it is important to reduce the electric field in both the vertical and lateral directions at the device edge. This is achieved, according to various disclosed embodiments, by utilizing two-dimensional voltage dividers in the vertical and lateral directions. Vertically, this goal is accomplished by utilizing the voltage drop across depletion layers created under reverse bias in mesa regions that are mainly compensated by the permanent charges in the termination cells. Laterally, this goal is accomplished by utilizing either resistive or diode voltage dividers located between the active region and device edge. As described, the structure can provide a very large effective resistance (equivalent to megohms or gigohms or more, in a linear approximation) between the power supply (or load) and the ground terminals.

Figure 1A:
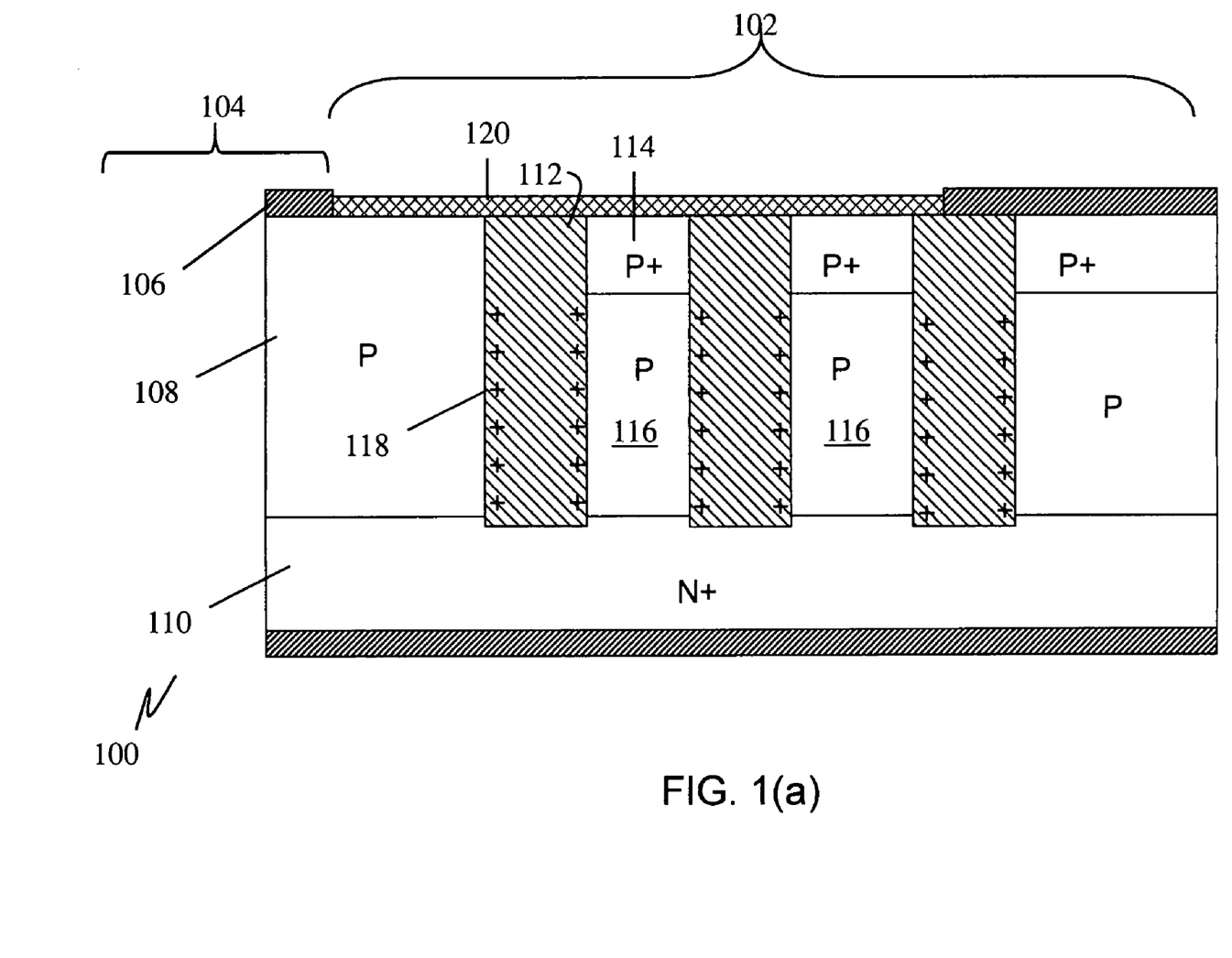
FIG. 1(a) is a cross-sectional structural diagram depicting a semiconductor device region, in accordance with an embodiment.

With reference to FIG. 1(a), a cross-sectional structural diagram depicts a semiconductor device region 100, in accordance with an embodiment. The semiconductor device region 100 includes an edge termination region 102 and an active device region 104. The portion of the active area 104 approaching the edge termination region 102 may be depicted as including a metallization 106, a body region (or p epitaxial layer) 108 and a drain region 110. The active area (which is not depicted in detail) can be comprised of a diode, JFET, MOSFET, IGBT or any other device or devices. The device structure of the active region 104 can of course be different for different device types.

The structure illustrated in the edge termination region 102 will provide vertical and lateral voltage dividers. Trenches 112 are alternated with semiconductor mesa regions 114/116, shown (in this example) with a more highly doped region 114 above a lightly doped region 116. The trenches 112 are preferably filled with a dielectric material which includes positive permanent charge 118. This permanent charge is preferably provided by ions implanted into a silicon dioxide dielectric, but (as discussed below) other implementations can be used instead.

The charge density on the sidewalls of the trenches is preferably sufficient to induce inversi of the semiconductor material. When the permanent charge is positive (as shown), the induced inversion layer will be viewed as an essentially two-dimensional "electron gas." This electron gas conducts like the channel of an insulated gate transistor in the ON state, and will accordingly provide a series impedance from the topside semiconductor region to the backside drain.

At reverse bias, the trenches 112 assist in providing a vertical leakage path. As discussed below, this path combines synergistically with the lateral impedances provided to generate a total impedance, from source to drain, which permits a small amount of current to flow (and thereby define a voltage distribution). The amount of current is limited by this structure, to achieve voltage spreading without excessive power loss or large local current density.

To distribute the voltage in the lateral direction, a primarily lateral electrically conductive path 120 is provided between adjacent termination trenches 112. While the path 120 is primarily lateral, practical fabrication considerations may include some vertical components in the design. The conductive path 120 can be formed for example by utilizing a resistive or semi-resistive material, such as polysilicon or semi-insulating polysilicon (SIPOS), which contacts the semiconductor mesa regions 114 between the trenches 112. Such an arrangement provides a resistive network or voltage divider, as described below.

Figure 1B:
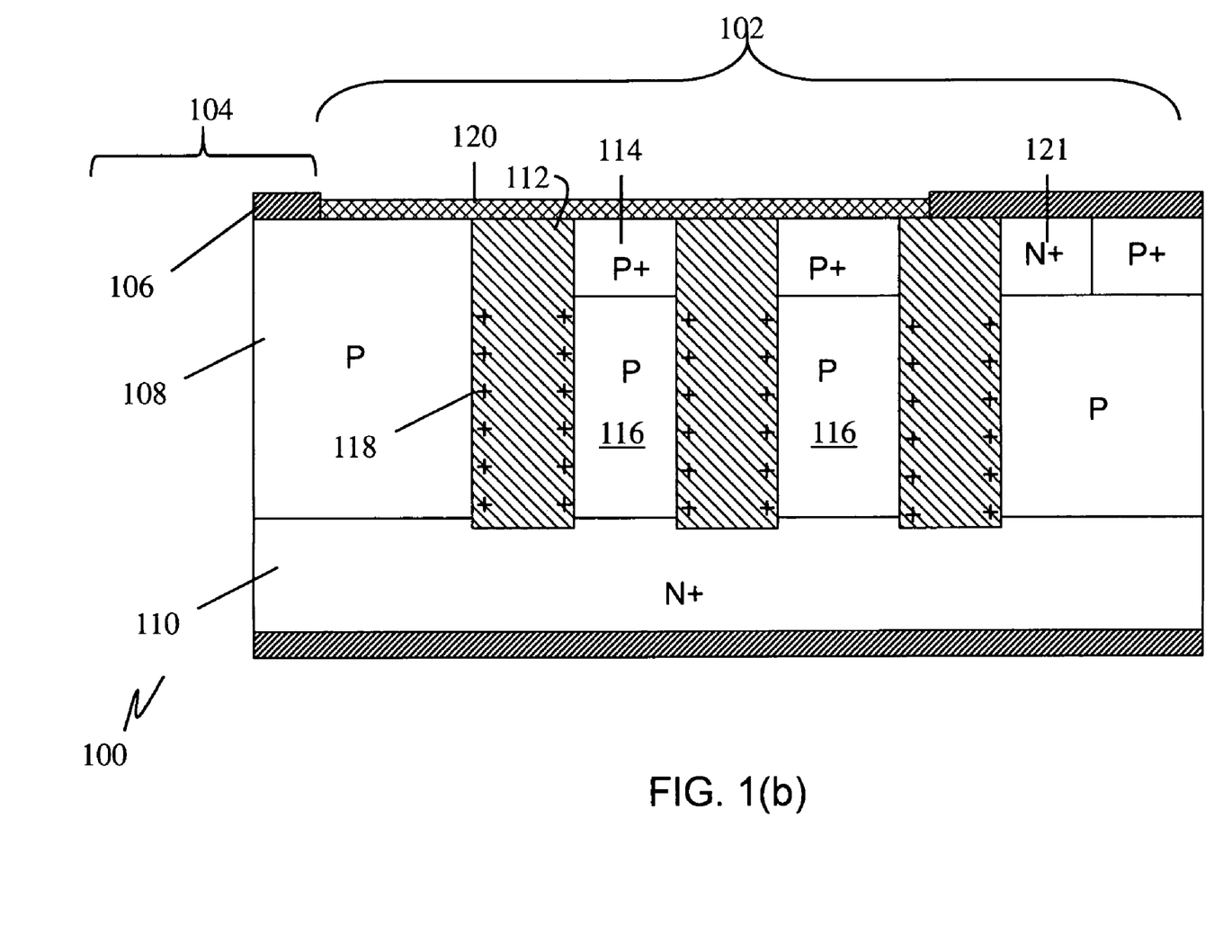
FIG. 1(b) is a cross-sectional structural diagram depicting a semiconductor device region, in accordance with an embodiment.

FIG. 1(b) is identical to FIG. 1(a) except for the addition of an n+ region 121 at the final termination trench. The region 121 is used to facilitate current flow between lateral path 120 and the backside n+ 110. It can also be used to suppress parasitic conduction paths. The use of region 121 as a channel stopper is well known by those skilled in the art.

Figure 2:
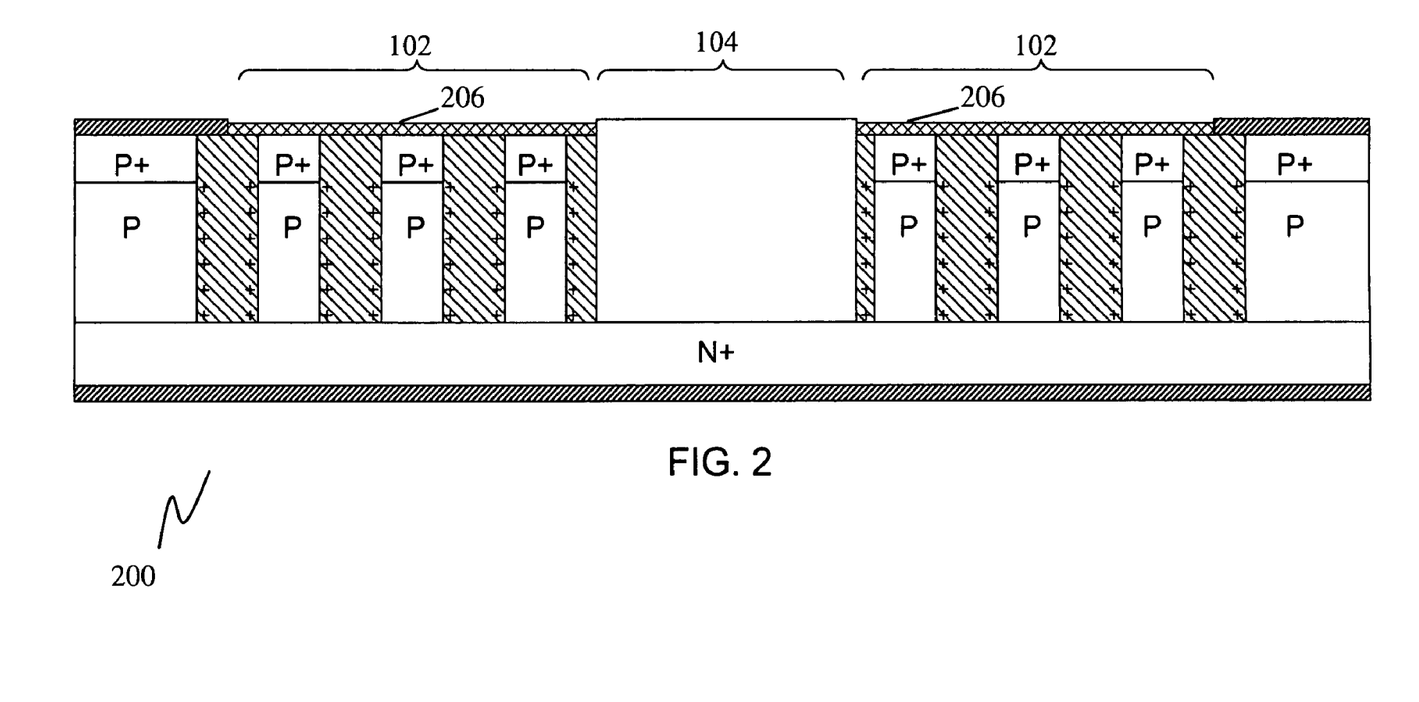
FIG. 2 is a cross-sectional structural diagram depicting a termination region, in accordance with an embodiment.

FIG. 2 illustrates the termination shown in FIG. 1(a) where termination cells 102 of a PN diode 200 are depicted. It should be noted that the number of cells shown in FIG. 2 is for illustration purpose only and may typically be varied. A conductive path 206 is formed laterally between the core cells (not shown) and the termination cells 102 of the device 200. In this example the termination cells have permanent charge on the sidewalls of dielectric trenches, but of course this can be widely modified.

Figure 3:
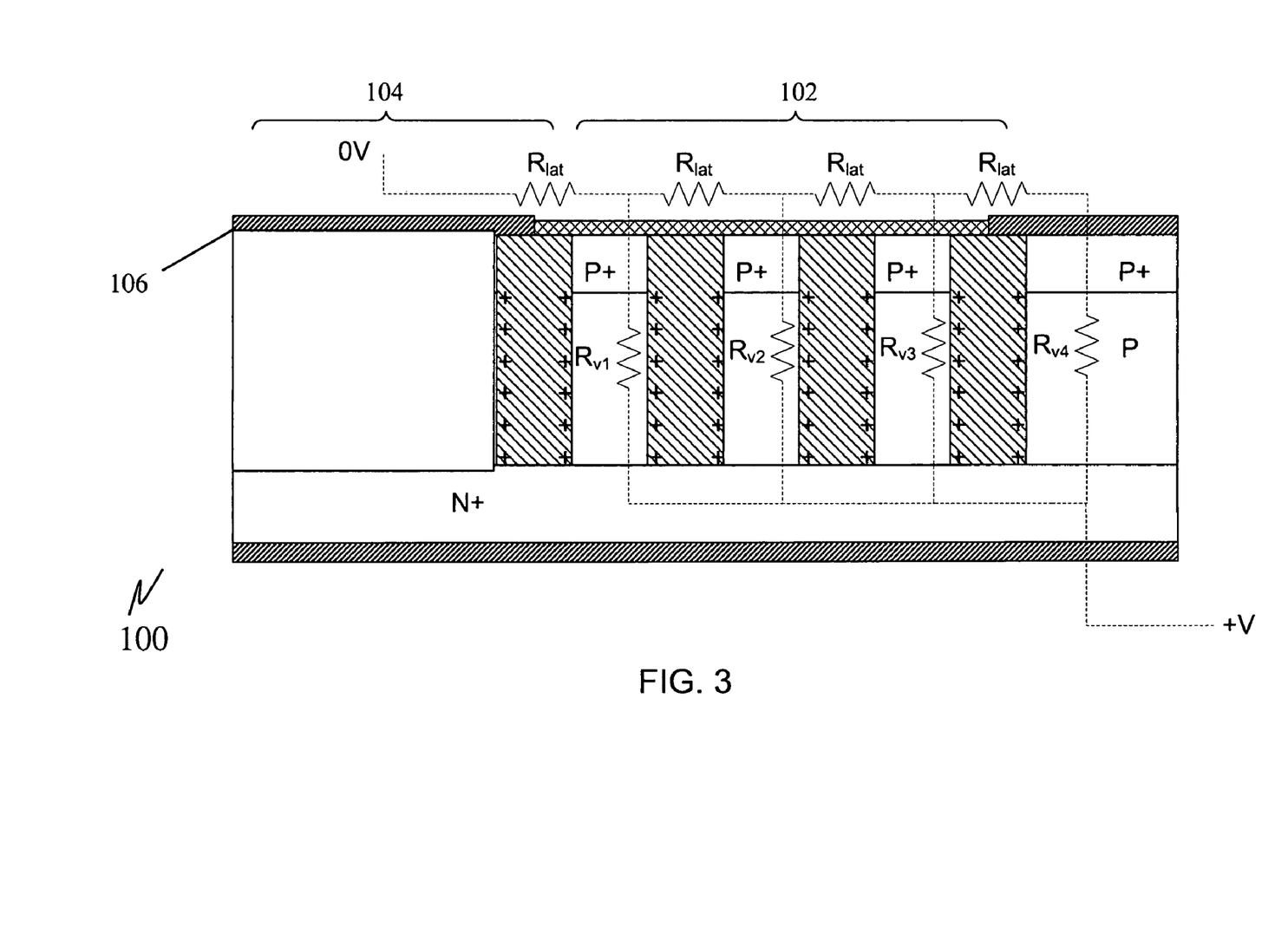
FIG. 3 is a cross-sectional structural diagram and a circuit diagram depicting a termination region, in accordance with an embodiment.

FIG. 3 is an equivalent circuit diagram of the structure of FIG. 1. Reference numbers are the same as in FIG. 1(a), but are generally omitted here to avoid interference with the overlaid circuit diagram.

In the equivalent circuit, it can be seen that a resistive ladder of lateral elements $R_{lat}$ is connected to ground, at successive nodes, through successive vertical impedances Rv1, Rv2, Rv3, Rv4, etc. Thus under nonzero current flow the voltage on Rv1 will be larger than the voltage on Rv2, and the voltage on Rv3 will be smaller yet.

With positive bias +V applied to the bottom contact and a 0V bias applied to the top active contact 106. It is worth noting that the vertical resistance components Rv1, Rv2, Rv3 and Rv4, as depicted, are due to reverse bias leakage current of the P type mesa and the N+ substrate at the PN junction. The resulting impedance is nonlinear and is dependent on the applied voltage (+V). (In fact, these leakage paths, which are shown here as resistors, can more precisely be described as leakage current through a diode.)

With a sufficient number of termination trenches 112 and suitable resistance of the conductive path 120, the voltage drop can be distributed to provide a high breakdown voltage at the termination. The lateral electrically conductive path 120 can be formed using silicon, poly-silicon, metal, SiPOS, or other suitable materials. In another embodiment, the lateral resistive path can also be formed on a dielectric layer located above the semiconductor surface (not shown in FIG. 1(a)) where electrical contacts are made to the semiconductor mesa material 114 as needed.

Figure 4:
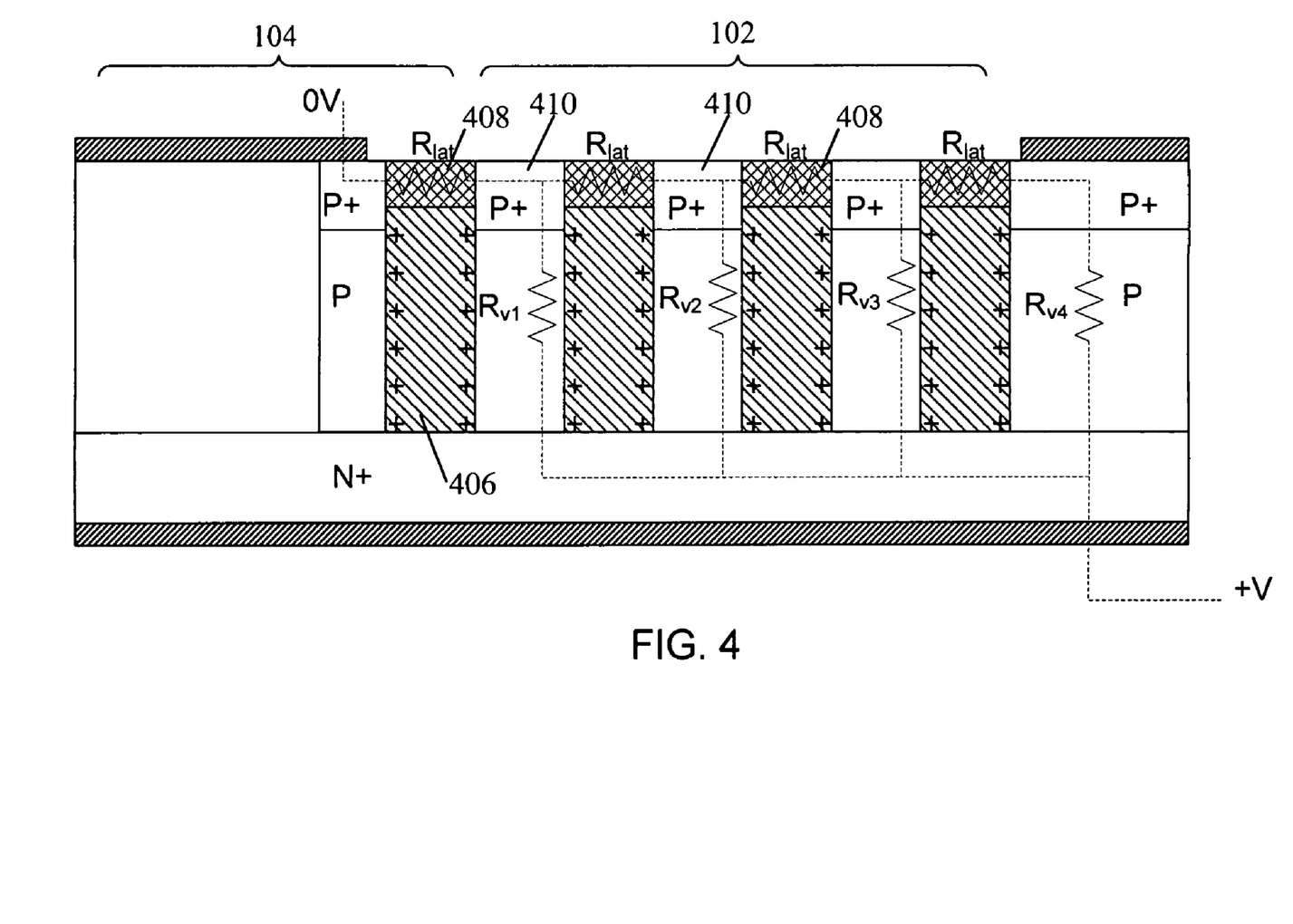
FIG. 4 is a cross-sectional structural diagram and a circuit diagram depicting a termination region, in accordance with an embodiment.

FIG. 4 shows an alternative embodiment, including core cells 104 and termination cells 102. In this class of embodiments the resistive material 408 that forms the lateral conductive path is formed in the trenches 406 themselves, and is in electrical contact with a top layer 410 of the adjacent semiconductor mesa regions. This top layer can be silicon, poly-silicon, a metal silicide, or can even be a metal (such as selectively-deposited tungsten). The resistive material 408 in the trenches can be for example polysilicon. The polysilicon is doped with the same conductivity type as the semiconductor mesa material to form a resistor.

Alternatively, in another embodiment the resistive material 408 in the trenches 406 is doped with an opposite type material of the semiconductor mesa to form a PN junction. In the latter case the PN junctions are arranged such that they are reverse biased when the device is in the voltage blocking condition.

Figure 5:
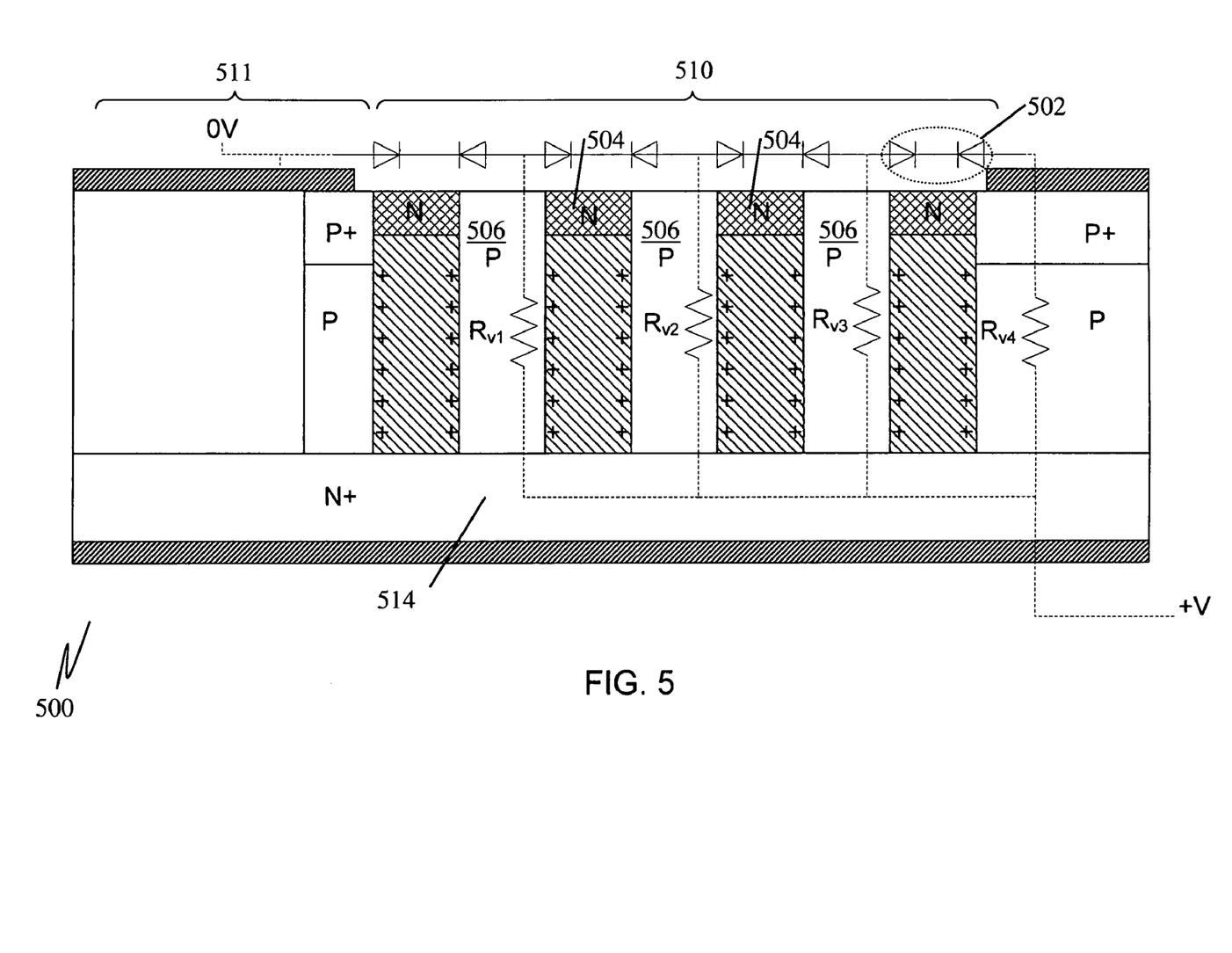
FIG. 5 is a cross-sectional structural diagram and a circuit diagram depicting a termination region, in accordance with an embodiment.

In another class of embodiments the lateral impedance is at least partly provided by opposed diode pairs 502 (circled), as shown in FIG. 5. The diodes can be provided, for example, by forming polysilicon regions 504 on top of the termination area 510. The polysilicon regions 504 are doped n-type and alternate with doped p-type region 506 to form the opposed diode pairs. The reverse biased PN junctions of the opposed diode pairs spread the voltage in the lateral direction. The leakage of the bottom diode formed by 506 and N+ region 514 may be considered a small current source in generating a voltage distribution.

Figure 6:
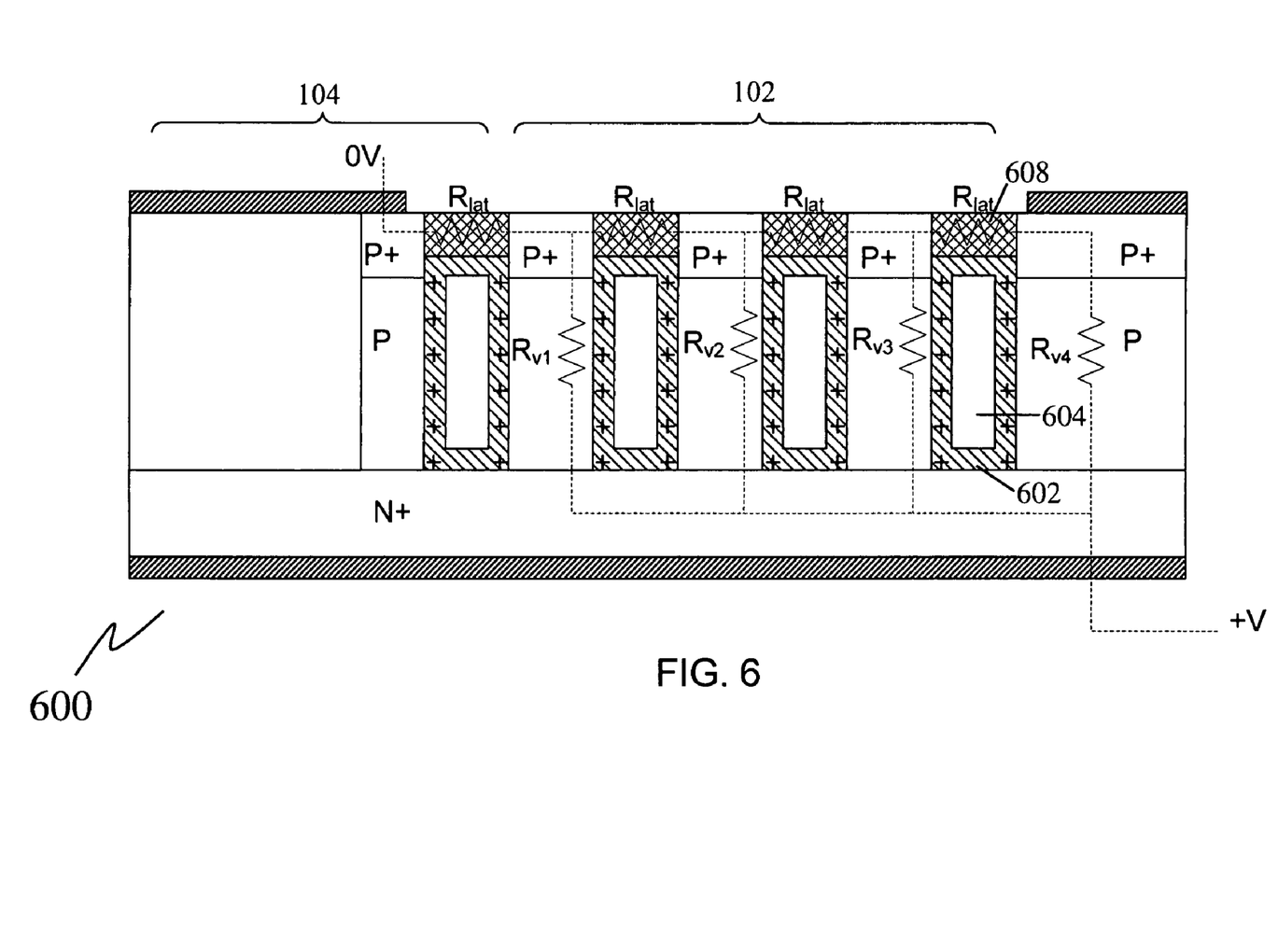
FIG. 6 is a cross-sectional structural diagram and a circuit diagram depicting a termination region, in accordance with an embodiment.

FIG. 6 shows an alternate class of embodiments which are generally similar to the device shown in FIG. 4. However, in this class of embodiments the trenches 602 are only partially filled by dielectric material, leaving a void 604, either by design or by process limitations. The void 604 may be fully enclosed by the dielectric material 602 as shown or may extend to the resistive material 608.

Another method of forming the lateral electrically conductive path is to use termination trenches that have gaps or breaks in them so the termination trench rings are not completely continuous. A lateral leakage or conductive path is formed between active and edge termination regions that help spread the voltage laterally while the permanent charge is used to deplete the semiconductor material in the vertical direction. By setting the geometry of the gaps in the termination trenches appropriately, the resistance between adjacent termination rings can be changed.

Several versions of this class of embodiments are shown in FIGS. 7(a)-(e) where the top view layouts are shown as well as the resistive voltage dividers 706 (shown with dashed line) formed therein. Each layout may include device edges 702, termination trenches 704 and a lateral resistance network 706. It is worth noting that the width of the gaps or breaks between trenches 708 and their location and number can be varied in the same device. This results in different values of the lateral resistance 710. The various implementations differ in the type of the core cells (stripe or cellular), the geometry of the core cells, or the overall device geometry. While some sample geometries and layouts are shown, many others are possible.

Figure 7A:
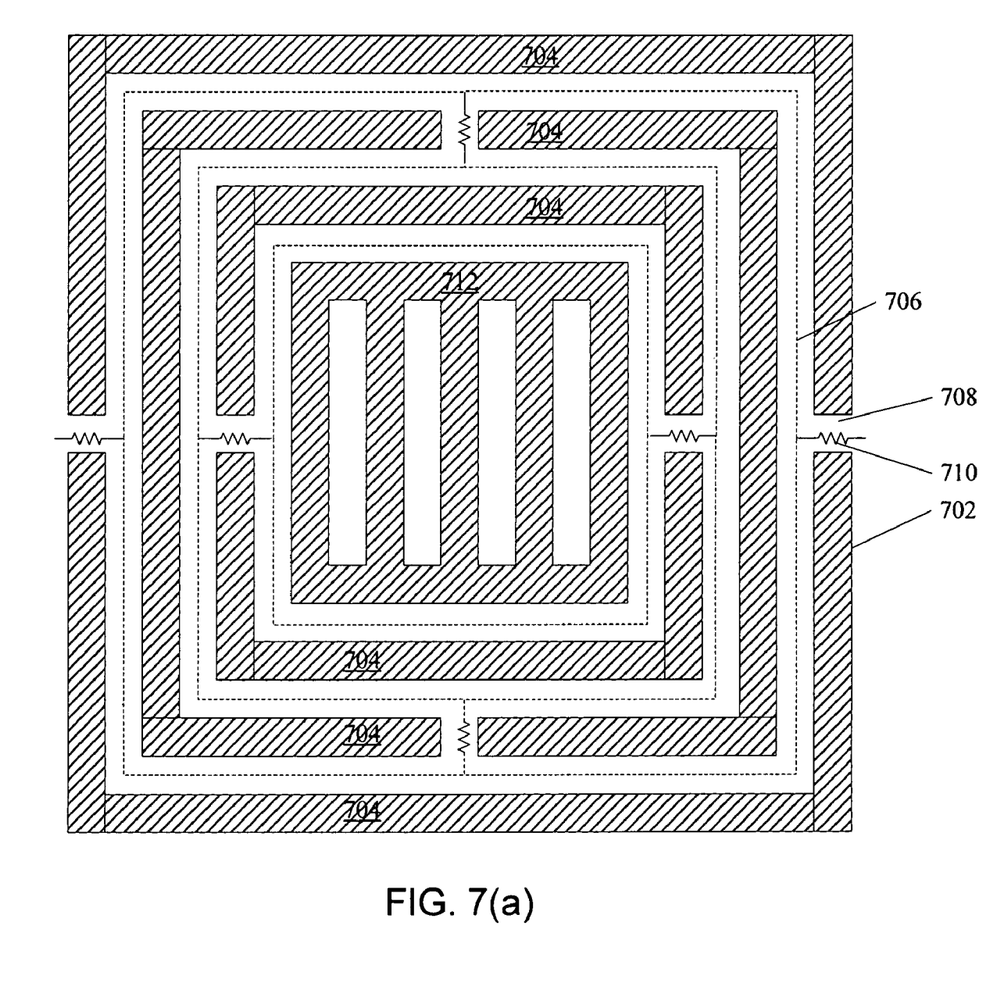
FIGS. 7(a)-(e) are top view layouts overlaid with circuit diagrams, in accordance with several embodiments.

In FIG. 7(a), the core (contained within 712) is laid out in a stripe array, and the termination trenches 704 are laid out as a staggered meander or maze structure, with trench gaps 708 having a lateral resistance 710.

Figure 7B:
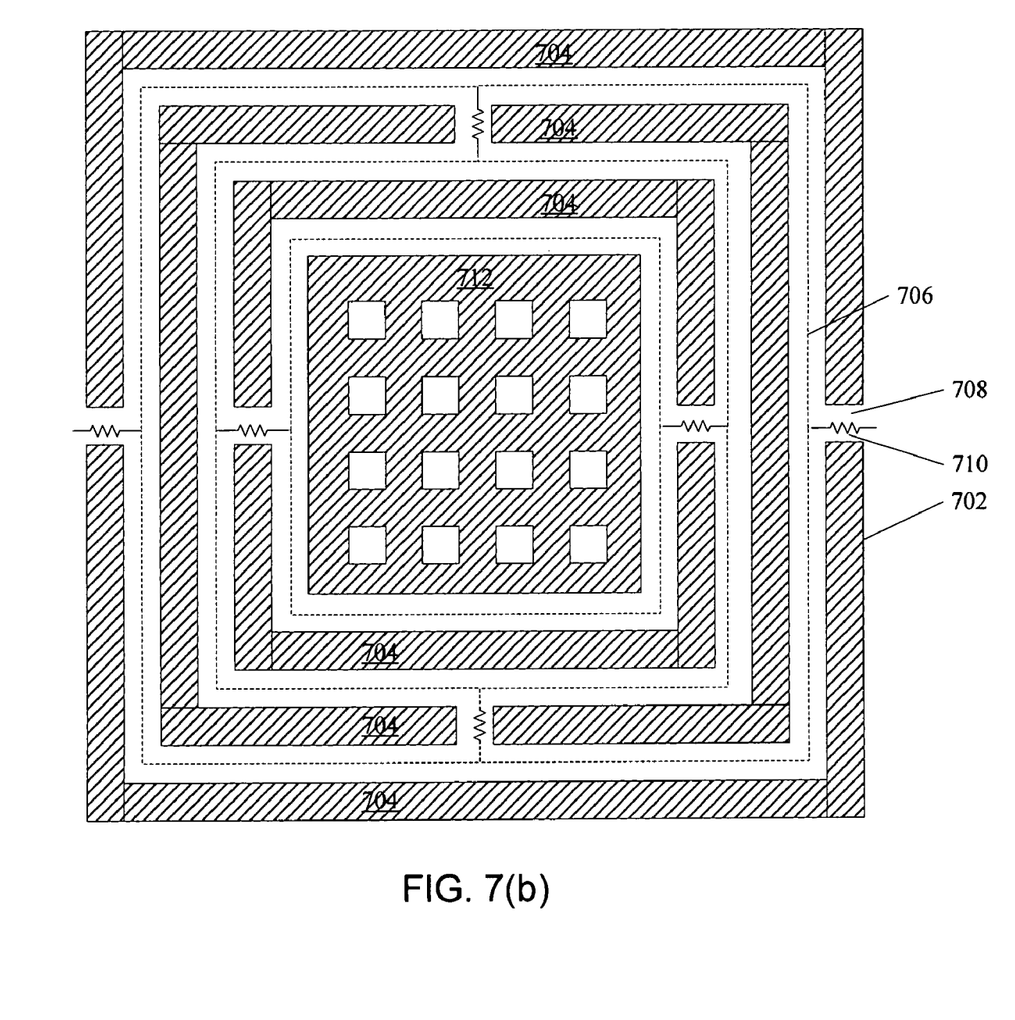

FIG. 7(b) shows a layout which is similar to FIG. 7(a), except that the core is laid out in a rectangular array of square active islands.

Figure 7C:
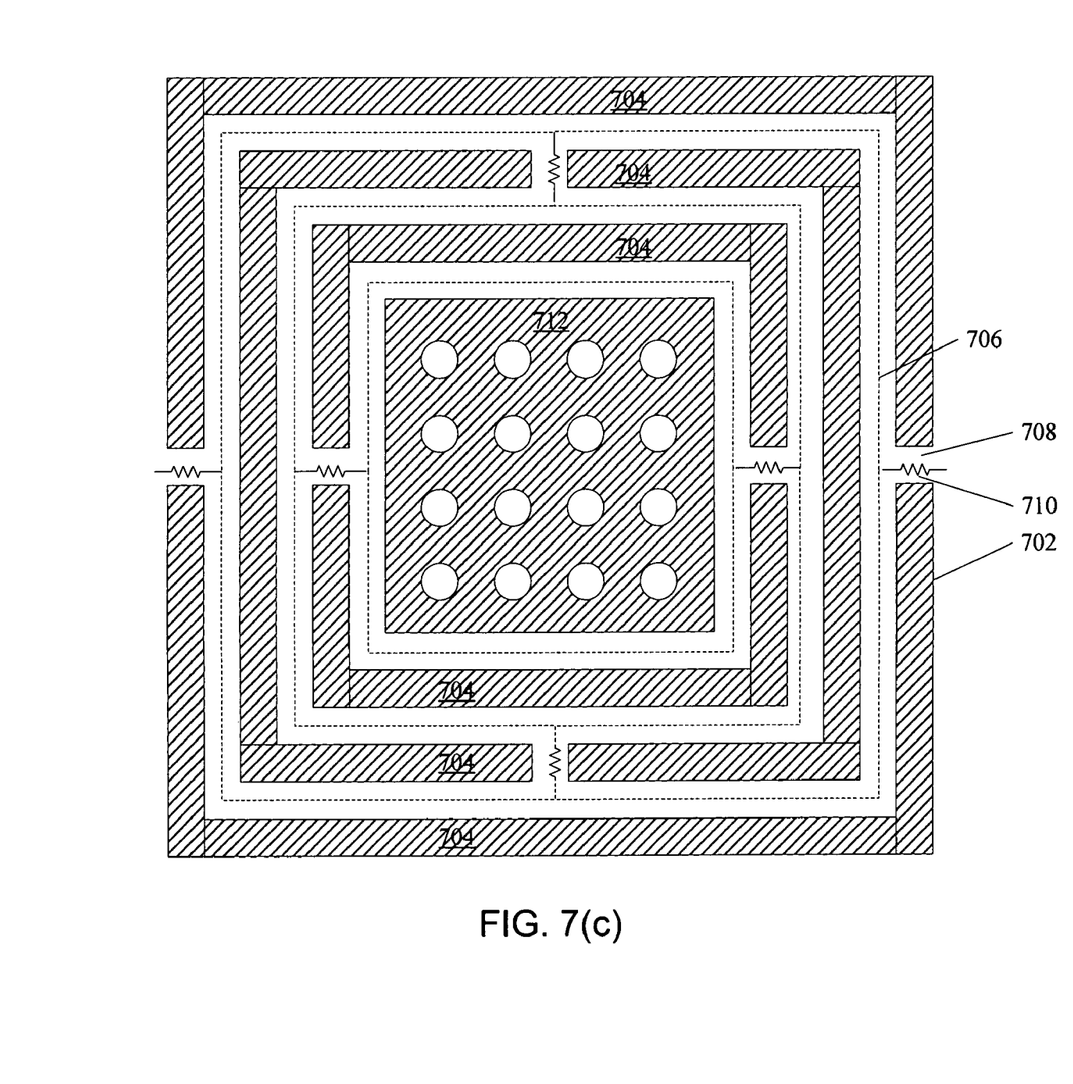

FIG. 7(c) shows a layout which is also similar to FIG. 7(b), except that the core is laid out in a rectangular array of cylindrical active islands.

Figure 7D:
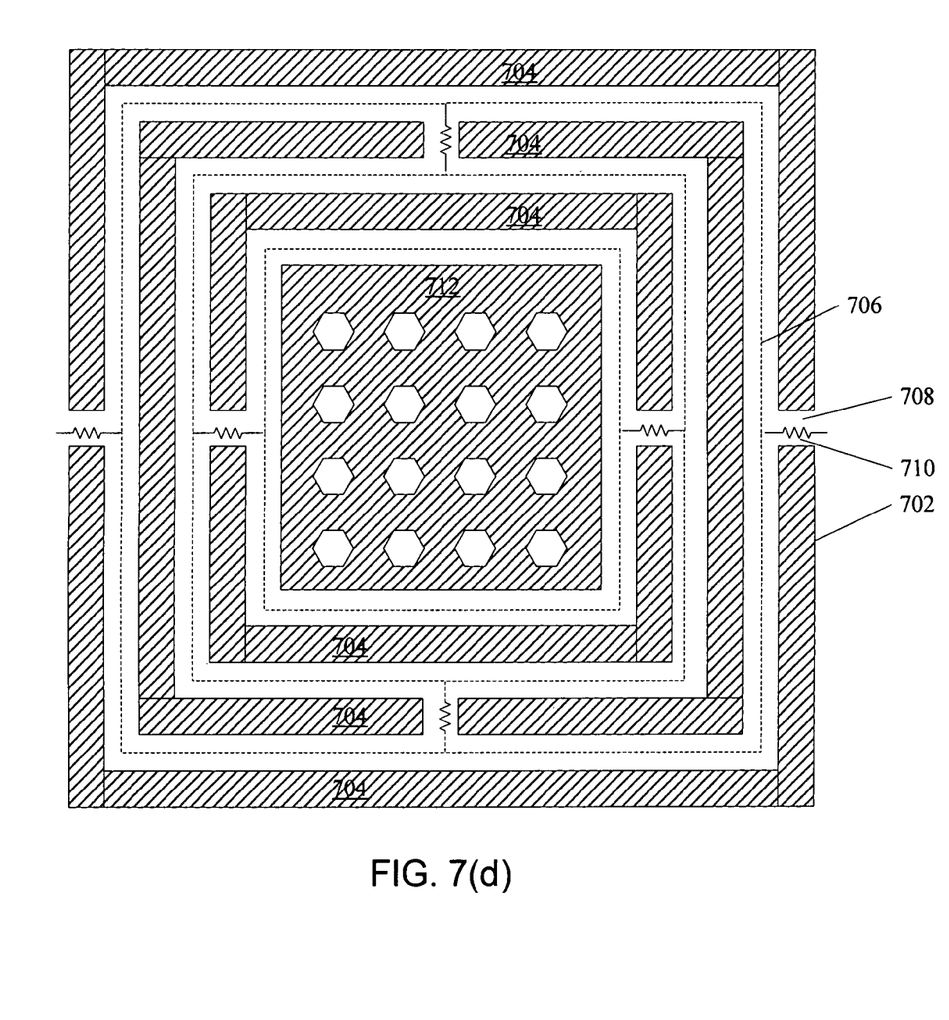

FIG. 7(d) shows another layout which is also similar to FIG. 7(a), except that the core is laid out in a rectangular array of hexagonal active islands.

Figure 7E:
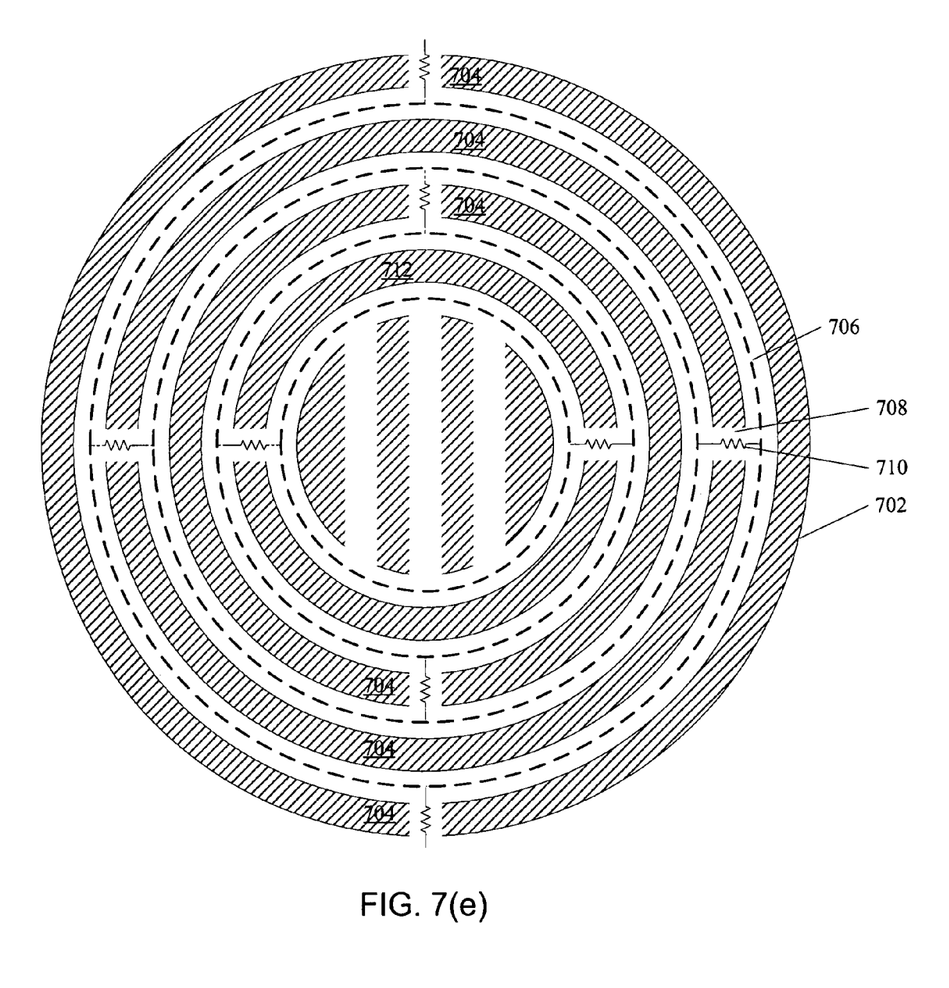

FIG. 7(e) shows another layout which is also similar to FIG. 7(a), except that the termination maze is generally circular.

According to various embodiments, there is provided: a high-voltage termination structure includes a peripheral voltage-spreading network. One or more trench structures are connected at least partly in series between first and second power supply voltages. The trench structures include first and second current-limiting structures connected in series with a semiconductor material, and also include permanent charge in a trench-wall dielectric. The current-limiting structures in the trench structures are jointly connected in a series-parallel ladder configuration. The current-limiting structures, in combination with the semiconductor material, provide a voltage distribution between the core portion and the edge portion.

According to various embodiments, there is provided: a high-voltage termination structure, comprising: a peripheral voltage-spreading network, comprising one or more trench structures connected at least partly in series between first and second power supply voltages; said trench structures respectively comprising first and second current-limiting structures connected in series with a semiconductor material and includes permanent charge in a trench-wall dielectric, wherein said current-limiting structures in said multiple ones of said trench structures are jointly connected in a series-parallel ladder configuration; whereby said current-limiting structures, in combination with said semiconductor material, provide a voltage distribution between said core portion and said edge portion.

According to various embodiments, there is provided: a method of providing high-voltage termination in a semiconductor device having a core portion and an edge portion, said method comprising: providing current-limiting structures connected in series with a semiconductor material and includes permanent charge in a trench-wall dielectric; and providing a voltage distribution between a core portion and an edge portion.

According to various embodiments, there is provided: a high-voltage device termination structure, comprising: a patterned combination of at least one first structure which conducts lateral current with one or more second structures which do not conduct lateral current; said first structure being laterally confined, by said second structures, to define a continuous path from a core portion to an edge portion, which is more than three times as long as the direct distance from said core portion to said edge portion; whereby the conductivity of said first structure defines a voltage distribution between said core portion and said edge portion.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

It should be noted that in all the above embodiments the resistive material can be formed over a dielectric material that covers the surface and the device can be covered by a suitable dielectric material.

The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

It is understood by those of ordinary skill in the art that in all the above embodiments that the number of core cells and the specific implementations of the termination will vary depending on the specifics of the implementation and any depictions illustrated herein should not be considered a limitation in any way.

It is also understood that the N+ substrate can be replaced by an N/N+ structure such that the trench bottom in the above figures extends to the N layer located above the N+ layer.

It is also understood that the design configurations remain valid if the opposite polarity of the permanent charge and the semiconductor materials types are used.

The component of lateral resistance, in the equivalent resistor ladder shown in FIG. 3, can be adjusted in various ways, e.g. by adjusting the width of the trenches. Wide trenches may be particularly advantageous at the device edge.

Of course the device parameters and dimensions will be scaled appropriately for different supply voltages. One way to accomplish voltage scaling is e.g. by considering voltage drop per lateral micron at the edge.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A high-voltage termination structure, comprising:
   a peripheral voltage-spreading network, comprising one or more trench structures connected at least partly in series between first and second voltages;
   said trench structures respectively comprising current-limiting structures which are connected in series with a semiconductor material, and which include intentionally introduced net permanent charge in a trench-wall dielectric, wherein said current-limiting structures, in combination with said semiconductor material, provide a voltage distribution of the difference between said first and second voltages.

2. The structure of claim 1, wherein said first and second voltages are power supply voltages.

3. The structure of claim 1, wherein said semiconductor material is silicon.

4. The structure of claim 1, wherein at least one said current-limiting structure comprises a junction diode.

5. The structure of claim 1, wherein said peripheral voltage-spreading network completely surrounds a core portion which includes active semiconductor devices.

6. The structure of claim 1, wherein said permanent charge in said sidewalls is sufficient to cause inversion of at least one adjacent portion of semiconductor material.

7. The structure of claim 1, wherein said trench structures respectively comprise first and second current-limiting structures connected in series with a semiconductor material, wherein the first and second current-limiting structures comprise diodes.

8. The structure of claim 7, wherein said semiconductor material is silicon.

9. A high-voltage device termination structure, comprising:

a patterned combination of at least one first structure which conducts lateral current with one or more second structures which do not conduct lateral current;

said first structure being laterally confined, by said second structures, to define a continuous path from a core portion to an edge portion, which is more than three times as long as the direct distance from said core portion to said edge portion;

whereby the conductivity of said first structure defines a voltage distribution between said core portion and said edge portion.

10. The device of claim 9, further comprising permanent charge positioned within said second structure, wherein said permanent charge induces leakage paths primarily along structure edges.

11. The device of claim 9, wherein said edge portion is a device edge.

12. The device of claim 9, wherein said core portion comprises at least one effective device.

13. The device of claim 9, wherein said second structures include a plurality of trenches containing a solid dielectric.

14. The device of claim 9, wherein said second structures include a plurality of dielectric trenches, and at least one of said dielectric trenches is wider than the other dielectric trenches.

15. A semiconductor device, comprising:

a core portion which controls passage of current between at least two terminals;

and an edge portion which includes a peripheral voltage-spreading network, comprising one or more trench structures connected at least partly in series between first and second terminals;

said trench structures respectively comprising current-limiting structures which are connected in series with a semiconductor material, and which include intentionally introduced permanent net charge in a trench-wall dielectric, wherein said current-limiting structures, in combination with said semiconductor material, provide a voltage distribution between said core portion and said edge portion.

16. The device of claim 15, wherein said core portion includes permanent charge, at one or more interfaces.

17. The device of claim 15, wherein said edge portion is a device edge.

18. The device of claim 15, wherein said core portion comprises at least one effective device.

19. The device of claim 15, wherein said second structures include a plurality of dielectric trenches, and at least one of said dielectric trenches is wider than the other dielectric trenches.

* * * * *